United States Patent
DiPaolo

(10) Patent No.: US 6,761,212 B2
(45) Date of Patent: Jul. 13, 2004

(54) SPIRAL COPPER TUBE AND ALUMINUM FIN THERMOSYPHON HEAT EXCHANGER

(75) Inventor: Frank E. DiPaolo, Dublin, OH (US)

(73) Assignee: Liebert Corporation, Columbus, OH (US)

( * ) Notice: Subject to any disclaimer, the term of this patent is extended or adjusted under 35 U.S.C. 154(b) by 0 days.

(21) Appl. No.: 09/866,370

(22) Filed: May 25, 2001

(65) Prior Publication Data

US 2002/0014324 A1 Feb. 7, 2002

Related U.S. Application Data

(60) Provisional application No. 60/207,057, filed on May 25, 2000.

(51) Int. Cl.[7] ................................................ F28F 13/12
(52) U.S. Cl. .................. 165/122; 165/121; 165/120; 165/104.21; 165/104.34; 165/128; 165/130; 165/143; 165/144; 165/145; 165/150; 165/151; 165/163; 165/173; 165/178
(58) Field of Search ........................ 165/104.34, 122, 165/128, 129, 130, 143, 144, 145, 173, 163, 178, 150, 151

(56) References Cited

U.S. PATENT DOCUMENTS

| | | | | | |
|---|---|---|---|---|---|
| 3,616,849 A | * | 11/1971 | Dijt | .......................... | 165/159 |
| 3,627,031 A | * | 12/1971 | Ware | .......................... | 165/22 |
| 3,807,493 A | * | 4/1974 | Stewart | .................. | 165/105 |
| 4,165,783 A | * | 8/1979 | Oplatka | .................. | 165/110 |
| 4,393,663 A | * | 7/1983 | Grunes et al. | ............ | 62/119 |
| 4,993,487 A | * | 2/1991 | Niggemann | .............. | 165/164 |
| 5,590,707 A | * | 1/1997 | Mauterer | ................. | 165/145 |
| 5,592,830 A | | 1/1997 | Baba et al. | .................. | 62/509 |
| 5,613,554 A | * | 3/1997 | Bull et al. | .................. | 165/150 |
| 5,622,055 A | * | 4/1997 | Mei et al. | ................... | 62/113 |
| 5,701,751 A | * | 12/1997 | Flores | ......................... | 62/169 |
| 5,806,583 A | | 9/1998 | Suzuki et al. | ............ | 165/104.33 |
| 5,823,248 A | | 10/1998 | Kadota et al. | ........... | 165/104.33 |
| 5,953,930 A | * | 9/1999 | Chu et al. | .................. | 62/259.2 |
| 6,005,772 A | | 12/1999 | Terao et al. | ................ | 361/699 |
| 6,023,935 A | * | 2/2000 | Okazaki et al. | ............... | 62/119 |
| 6,098,420 A | * | 8/2000 | Furukawa et al. | ............ | 62/484 |
| 6,116,330 A | * | 9/2000 | Salyer | ....................... | 165/48.2 |
| 6,119,767 A | | 9/2000 | Kadota et al. | ........... | 165/104.33 |
| 6,131,647 A | * | 10/2000 | Suzuki et al. | ........... | 165/104.33 |
| 6,223,810 B1 | * | 5/2001 | Chu et al. | ............... | 165/104.33 |
| 6,382,308 B2 | * | 5/2002 | Okamoto | ............... | 165/104.21 |
| 6,397,934 B2 | * | 6/2002 | Osakabe et al. | ......... | 165/104.21 |
| 2001/0042614 A1 | | 11/2001 | Okamoto | ............... | 165/104.21 |

FOREIGN PATENT DOCUMENTS

JP          2001-330382          11/2001

* cited by examiner

Primary Examiner—Henry Bennett
Assistant Examiner—Nihir Patel
(74) Attorney, Agent, or Firm—Howrey Simon Arnold & White LLP

(57) ABSTRACT

The present invention is directed to a thermosyphon heat exchanger. The thermosyphon system eliminates the need for costly and inefficient moving parts in the cooling system. The system also minimizes failures rendering the system inoperable by eliminating mechanical components subject to breakdowns that would render the system inoperable. The design of the heat exchanger coils provides for increased efficiency, reduced cost, and simplified construction and maintenance. The system further reduces the energy consumption required for cooling operation while still providing excellent cooling performance.

8 Claims, 3 Drawing Sheets

US 6,761,212 B2

SPIRAL COPPER TUBE AND ALUMINUM FIN THERMOSYPHON HEAT EXCHANGER

CROSS REFERENCE TO RELATED APPLICATION AND PRIORITY CLAIM

This application claims the benefit of Provisional U.S. patent application Ser. No. 60/207,057, entitled "Spiral Copper Tube and Aluminum Fin Thermosyphon Heat Exchanger", naming the same inventor as identified herein and filed May 25, 2000.

BACKGROUND OF THE INVENTION

With the expansion of telecommunication and computer technology, increasing amounts of electronic equipment are required at various commercial and business facilities. To facilitate interconnection and access to such equipment, it is typically installed in a common enclosure. Further, technological advancements are permitting more and more electronic equipment to be fit into increasingly smaller spaces. These forces are combining to produce relatively dense electronic installations that generate increasing amounts of heat. For such equipment to operate properly, it is necessary to provide a relatively stable and comfortable temperature and humidity. This has typically been accomplished through the use of air conditioning for the enclosures housing the equipment.

Air conditioners used to perform such cooling typically rely on compression and expansion of a working fluid to absorb heat from the area to be cooled and reject this heat into another environment. In addition to being a relatively costly component, the compressors required are typically electrically powered, which results in significant energy consumption. Additionally, the compressors are typically somewhat noisy, which is disadvantageous because the systems used to cool electronic enclosures are frequently located in areas that are occupied on a continual basis. Noise is therefore disrupting to the occupants. Another disadvantage of compressor-based systems is that the compressors and primemovers therefor, electrical or otherwise, are mechanical components that are subject to mechanical failure, which results in downtime of the equipment.

SUMMARY OF THE INVENTION

The present invention is directed to solving the problems associated with the compressor-based air-conditioning systems of the prior art. The cooling system of the present invention is based on a thermosyphon, which accomplishes heat transfer using the latent heat of vaporization of a working fluid. Thermosyphons do not require compressors, or any other moving part, in the cooling circuit, and are therefore more reliable, consume less energy, and are better suited to use in inhabited areas than their compressor-based counterparts.

It is therefore an object of the present invention to provide a thermosyphon-based cooling system that dispenses with the need for compressors and other moving parts in the cooling circuit. Another object of the present invention is to provide a low cost air-to-air heat exchanger. Yet another object of the present invention is to provide a heat exchanger with increased efficiency over prior art designs. Still another object of the invention is to provide a heat exchanger coil design that is simpler and less costly to manufacture than prior art designs.

DESCRIPTION OF ILLUSTRATIVE EMBODIMENTS

The present invention is directed generally to a thermosyphon heat exchanger, and specifically to a thermosyphon heat exchanger used to cool a cabinet or enclosure housing electrical or electronic equipment. Thermosyphon heat exchangers use the latent heat of vaporization of the working fluid to transfer heat from the evaporator to the condenser. The working fluid flows through the refrigeration circuit by vapor pressure and gravity flow; the refrigeration circuit contains no moving parts.

Figure 1:
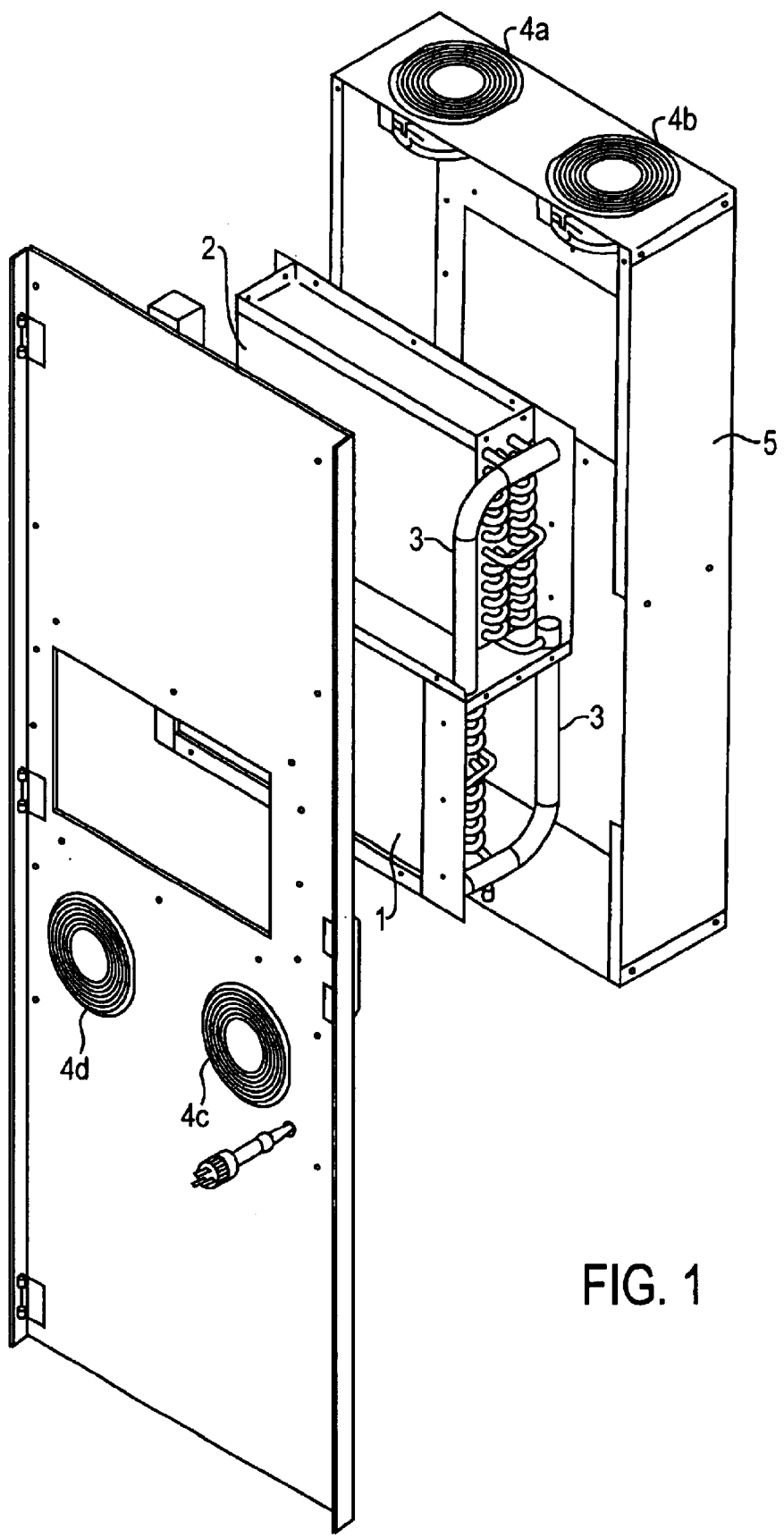
FIG. 1 is a drawing of a two-circuit, two-coil thermosyphon in accordance with the present invention adapted for use as an electronic enclosure cooler.

A thermosyphon heat exchanger in accordance with the present invention is illustrated in FIG. 1. The heat exchanger comprises an evaporator coil 1, a condenser coil 2, piping 3, four fans 4a–4d, a sheet metal enclosure 5, and a working fluid (not shown). The evaporator and condenser coils use a spiral copper tube construction, described in detail below. Spiral tube construction enhances performance of the heat exchanger by increasing the effective inside surface area of the tube.

The heat exchanger condenser coil 2 is mounted above the evaporator coil 1. Piping 3 interconnects the two coils. The system is charged with a refrigerant such as R-134a, R-410a, a methanol/water mixture, or an ethanol water mixture. There are no moving parts within the refrigeration circuit. Refrigerant is moved through the system due to vapor forces in the evaporator and liquid gravity feed from the condenser. On the evaporator side, two fans move inside cabinet air through the coil causing the working fluid to absorb heat from the interior of the enclosure. On the condenser side, two fans move cabinet exterior air through the condenser coil to extract the heat from the working fluid and reject it outside the enclosure.

Specifically, the thermosyphon heat exchanger operates as follows. At the beginning of the refrigeration cycle, working fluid, in liquid phase, is located in evaporator coil 1. Fans 4c and 4d force heated air from inside the enclosure through evaporator coil 1. As a result, the liquid phase working fluid absorbs heat from the interior of the enclosure to be cooled. As heat is absorbed by the working fluid, it transitions to the vapor phase, and vapor pressure causes the fluid to move upward through the evaporator tube circuits, through interconnecting piping 3a, and into the top of condenser coil 2.

Fans 4a and 4b force outside air through condenser coil 2, causing the outside air to absorb heat from the working fluid as it passes through the condenser. As the working fluid loses heat to the outside air, it transitions from vapor phase back to liquid phase and flows downward by gravity through condenser 2. Upon arriving at the bottom of condenser 2, the fluid continues to flow by gravity through interconnecting piping 3b back to the bottom of evaporator 1 to repeat the refrigeration cycle.

A detailed diagram of condenser coil 2 is shown in FIGS. 2A through 2D. The evaporator coil is of similar construction, the principal difference being the connection of interconnecting piping 3. The heat exchanger coils include a plurality of aluminum fins 6. The fins include holes (not shown) through which copper tubes 7 are inserted. Each copper tube 7 is of hairpin shape, having a hairpin end 8 and a return end 9. The aluminum fins are stacked in parallel fashion, with the holes aligned, and hairpin copper tubes 7 are inserted therethrough, with all of the hairpin ends 8 at one end of the heat exchanger and all of the return ends 9 at the other.

To provide a continuous working fluid path through the heat exchanger, U-shaped return bends 10 are affixed to the return ends 9 of tubes 7. The sequence in which the return ends are connected determines the tube circuiting through the heat exchanger. The heat exchanger of the present embodiment is constructed using a spiral arrangement, meaning that the second return end of each tube is connected to the first return end of the next tube. This connection arrangement results in a spiral flow path wherein the working fluid flows into a first tube at a first end, through the first tube hairpin bend, back to the first tube second end, through a return bend and into a second tube at a first end, etc.

One benefit of the spiral tube construction is free draining of the working fluid, because there are no traps in the working fluid flow path. Gravity flow will cause the fluid to flow through each successive tube until it reaches the bottom of the tube circuit. Another benefit of the spiral tube arrangement is improved performance of the heat exchanger. Because the spiral path requires the working fluid to make numerous passes through the heat exchanger, more heat is transferred between the airflow through the fins and the working fluid, resulting in more efficient operation.

Figure 2A:
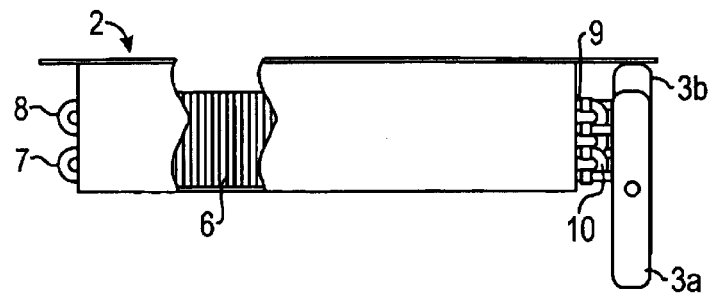
FIGS. 2A through 2D are various views of a single heat exchanger coil used as a condenser coil in the two-circuit, two-coil thermosyphon of the present invention.
Figure 2D:
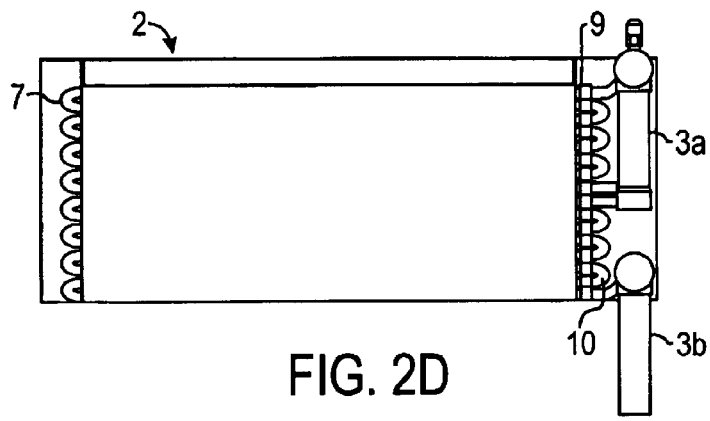
Figure 2B:
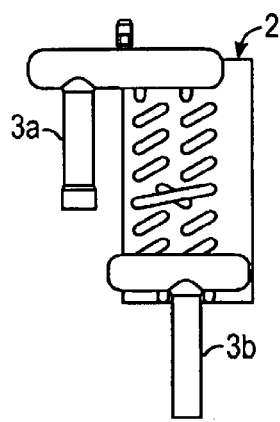
Figure 2C:
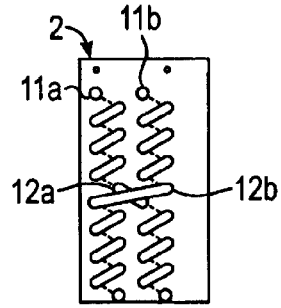
Figure 2C:
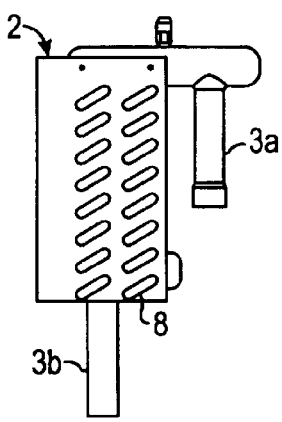

Another novel feature of the heat exchanger of the present invention is illustrated more clearly in FIG. 2b, which shows the return bend end of the heat exchanger coil. The invention is described below in the context of the condenser coil, but the novel features are equally applicable to the evaporator coil. The condenser includes two parallel working fluid circuit paths. A first path begins at inlet 11a, and a second begins at inlet 11b.

Airflow through the heat exchanger is from right to left as shown in FIG. 2b. As air flows through the heat exchanger and passes over the first tube circuit it absorbs heat from the working fluid flowing in that first circuit. The heated air then passes over the second tube circuit path, however, because the air was already heated by the first circuit path its capacity to absorb heat is reduced. Thus the airstream cannot absorb as much heat from the second path as from the first, making the second path less efficient at rejecting heat from the working fluid to the outside air.

To remedy this problem, the heat exchanger of the present invention includes crossover bends 12a and 12b. At crossover bend 12a, the first path moves from the left side of the heat exchanger to the right. At crossover bend 12b, the second path switches from the right side of the heat exchanger to the left. Switching the circuit paths relative to the airflow allows each of the parallel circuits to be exposed directly to the outside airflow for part of the circuit. This equalizes the heat transfer of the parallel circuit paths and improves the overall efficiency of the heat exchanger.

Figure 3:
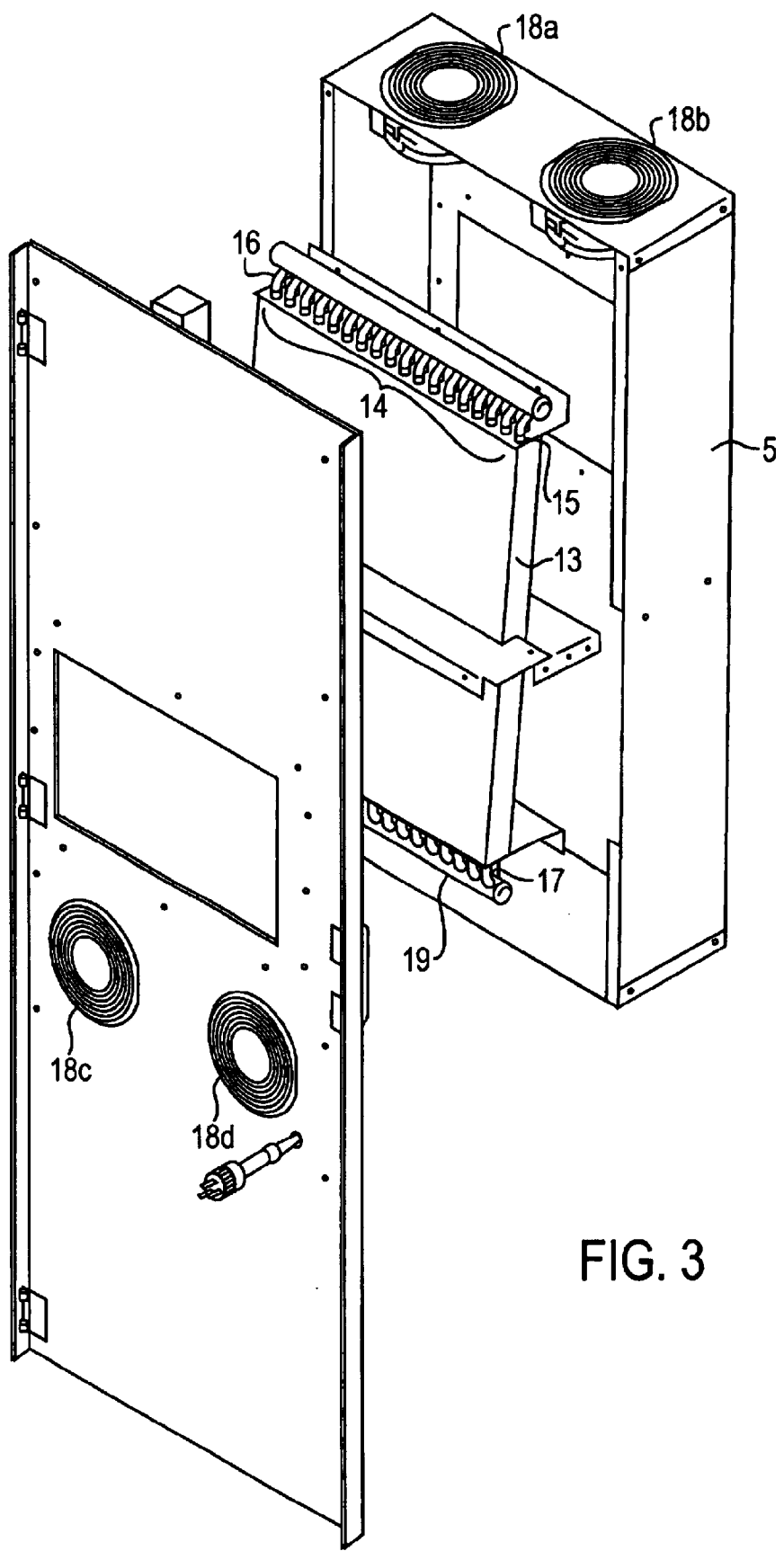
FIG. 3 is a drawing of a multi-circuit, single-coil thermosyphon in accordance with the present invention adapted for use as an electronic enclosure cooler.

An alternative embodiment of the thermosyphon heat exchanger in accordance with the present invention is the multi-circuit, single-coil thermosyphon illustrated in FIG. 3. This thermosyphon is similar to the two-circuit, two-coil thermosyphon described above, except that single coil 13 serves as both the evaporator and condenser. The single heat exchanger coil 13 includes numerous tube circuits 14. Each circuit uses only a single hairpin copper tube 15.

The single coil heat exchanger 13 is constructed such that the hairpin ends 16 of tubes 15 are mounted above the open or return ends 17. The open or return ends 17 of the heat exchanger tubes are all sealed into a common header 19. Common header 19 provides a way for the heat exchanger circuit to be easily charged with working fluid.

Because the common header is located at the lowest point of the heat exchanger, it is ensured that the working fluid is the same for each tube circuit. Prior art single-coil heat exchangers were constructed with each individual tube circuit sealed off from the others. The prior art design required each tube to be individually evacuated and charged, which is both time-consuming and costly. This time-consuming and costly procedure is avoided by the tube circuit design of the present invention.

Operation of the single-coil thermosyphon heat exchanger is substantially the same as the two-coil version described above. Working fluid is present in liquid phase at the bottom portion (evaporator portion) of heat exchanger coil 13. Fans 18c and 18d force warm air from within the enclosure through the lower portion (evaporator portion) of the heat exchanger coil, causing the working fluid to absorb heat from the air. The absorbed heat causes the working fluid to transition from the liquid phase to the vapor phase, and the vapor then rises through the center of the heat exchanger tubes 15.

As the vaporized working fluid rises, it passes into the upper portion (condenser portion) of heat exchanger coil 13. Fans 18a and 18b force outside air through the upper condenser portion of heat exchanger coil 13, causing the outside air to absorb heat from the working fluid. As heat is absorbed, the working fluid transitions from the vapor phase back to the liquid phase and condenses on the inner walls of the heat exchanger tubes 15. The condensed working fluid then flows downward by gravity back to the lower condenser portion of heat exchanger coil 13 and the cycle repeats.

Additional modifications and adaptations of the present invention will be obvious to one of ordinary skill in the art, and it is understood that the invention is not to be limited to the particular illustrative embodiments set forth herein. It is intended that the invention embrace all such modified forms as come within the scope of the following claims.

REFERENCES

The following references, to the extent that they provide exemplary procedural or other details supplementary to those set forth herein, are specifically incorporated herein by reference.

Not Applicable

What is claimed is:

1. A thermosyphon using a working fluid therein, comprising:
  a) an evaporator having a front face, a back face, a top and a bottom, the evaporator comprising a plurality of cooling fins and at least one working fluid flow path having an inlet adjacent the bottom and an outlet adjacent the top, the at least one working fluid flow path spiraling throughout the fins of the evaporator from the inlet to the outlet such that first tubular sections of the flow path pass adjacent the front of the evaporator and second tubular sections of the flow path pass adjacent the back of the evaporator, the first and second tubular sections being interconnected by a plurality of hairpin turns on sides of the evaporator;
  b) a condenser disposed above the evaporator, the condenser having a front face, a back face, a top and a bottom, the condenser comprising a plurality of cooling fins and at least one working fluid flow path having an inlet adjacent the top and an outlet adjacent the bottom, the at least one working fluid flow path spiraling throughout the fins of the condenser from the inlet to the outlet such that first tubular sections of the flow path pass adjacent the front of the evaporator and second tubular sections of the flow path pass adjacent the back of the evaporator, the first and second tubular sections being interconnected by a plurality of hairpin turns on sides of the condenser;

c) first piping connecting the outlet of the evaporator working fluid flow path to the inlet of the condenser working fluid flow path, whereby working fluid evaporated in the evaporator is communicated from the evaporator to the condenser; and d) second piping connecting the outlet of the condenser working fluid flow path to the inlet of the evaporator working fluid flow path, whereby working fluid condensed in the condenser is communicated from the condenser to the evaporator.

2. The thermosyphon of claim 1, further comprising a plurality of fans, wherein at least one fan forces air through the evaporator fins and at least one fan forces air through the condenser fins.

3. The thermosyphon of claim 1, wherein the evaporator comprises a plurality of spiral working fluid flow paths.

4. The thermosyphon of claim 3, wherein the plurality of spiral working fluid flow paths include crossover bends disposed so that equal portions of each spiral working fluid flow path are first exposed to airflow through the cooling fins from the front of the evaporator.

5. The thermosyphon of claim 1, wherein the condenser comprises a plurality of spiral working fluid flow paths 6. The thermosyphon of claim 5, wherein the plurality of spiral working fluid flow paths include crossover bends disposed so that equal portions of each spiral working fluid flow path are first exposed to airflow through the cooling fins from the front of the condenser.

7. The thermosyphon of claim 1, wherein:

a) the evaporator comprises a plurality of evaporator spiral working fluid flow paths;

b) the evaporator spiral working fluid flow paths include crossover bends disposed such that equal portions of each spiral working fluid flow path are first exposed to airflow through the evaporator cooling fins from the front of the evaporator;

c) the condenser comprises a plurality of condenser spiral working fluid flow paths; and d) the condenser spiral working fluid flow paths include crossover bends disposed such that equal portions of each spiral working fluid flow path are first exposed to airflow through the condenser cooling fins from the front of the condenser.

8. The thermosyphon of claim 1, wherein the working fluid is selected from the group consisting of: R-134*a*, R-410*a*, methanol, ethanol, a mixture of methanol and water, and a mixture of ethanol and water.

* * * * *